(12) United States Patent
Bruce et al.

(10) Patent No.: US 6,498,096 B2
(45) Date of Patent: Dec. 24, 2002

(54) BORDERLESS CONTACT TO DIFFUSION WITH RESPECT TO GATE CONDUCTOR AND METHODS FOR FABRICATING

(75) Inventors: James Allan Bruce, Williston, VT (US); Jonathan Daniel Chapple-Sokol, Essex Junction, VT (US); Charles W. Koburger, III, Vienna, VA (US); Michael James Lercel, Williston, VT (US); Randy William Mann, Jericho, VT (US); James Spiros Nakos, Essex, VT (US); John Joseph Pekarik, Underhill, VT (US); Kirk David Peterson, Essex Junction, VT (US); Jed Hickory Rankin, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/800,911

(22) Filed: Mar. 8, 2001

(65) Prior Publication Data

US 2001/0019886 A1 Sep. 6, 2001

Related U.S. Application Data

(62) Division of application No. 09/076,525, filed on May 12, 1998, now Pat. No. 6,215,190.

(51) Int. Cl.$^7$ .............................................. H01L 21/44
(52) U.S. Cl. ....................... 438/666; 438/585
(58) Field of Search ................................. 438/585, 586, 438/589, 666

(56) References Cited

U.S. PATENT DOCUMENTS 5,164,325 A * 11/1992 Cogan et al. ............... 438/270
5,963,800 A * 10/1999 Augusto ..................... 257/334

* cited by examiner

Primary Examiner—John F. Niebling
Assistant Examiner—Angel Roman
(74) Attorney, Agent, or Firm—Connolly, Bove, Lodge & Hutz, LLP; Wiiliam D. Sabo

(57) ABSTRACT

A borderless contact to diffusion with respect to gate conductor is provided by employing a double insulating film stack as a mask for defining the gate conductor shapes for the entire chip and providing a relatively thin damage preventing layer on exposed conductive layer following defining the gate conductor shapes. In one embodiment, a borderless contact is provided by forming an insulating layer on a substrate, providing a conductive layer on the insulating layer, providing a second insulating layer on the conductive layer, providing a third insulating layer on the second insulating layer, removing preselected portions of the second and third insulating layers, providing a damage preventing layer in those areas where the second and third insulating layers have been removed, removing preselected portions of the third insulating layer, removing the damage preventing layer, removing exposed portions of the conductive layer, and removing now exposed portions of the second insulating layer.

11 Claims, 9 Drawing Sheets

BORDERLESS CONTACT TO DIFFUSION WITH RESPECT TO GATE CONDUCTOR AND METHODS FOR FABRICATING

CROSS-REFERENCE TO RELATED APPLICATION

This application is a divisional of U.S. patent application Ser. No. 09/076,525 filed May 12, 1998 now U.S. Pat. No. 6,215,190.

TECHNICAL FIELD

The present invention is concerned with providing a borderless contact to diffusion with respect to the gate conductor. The present invention permits the diffusion contact to overlap the gate conductor without shorting to the gate. In particular, the present invention is concerned with methods to provide a borderless contact to diffusion and gate conductor employing a single contact mask step. In addition, the present invention is concerned with a semiconductor structure having the desired borderless contact. The present invention is especially applicable for fabricating SRAM cells and logic with embedded SRAM.

BACKGROUND OF INVENTION

In the formation of semiconductor devices, it is necessary to provide both desired electrical contact between certain regions of the devices formed and also to prevent contact between various other regions of the devices formed on the substrate. One technique for accomplishing this has been by using photoresist and masking techniques wherein those areas to be exposed for electrical contact are patterned in the photoresist, and then by developing the patterned photoresist, to thereby expose the desired underlying regions. This technique normally requires several successive masks to perform the entire process, and in its performance each succeeding mask must be precisely aligned. However, as the technology advances, allowing for formation of smaller and smaller devices, it is increasingly difficult to maintain precise overlay tolerance, with the result that even small misalignments of the masks will result in the exposure of small portions or "borders" of regions that are intended to remain covered. Hence, electrical connections, e.g. by an overlay deposition of a metal, will connect not only the desired locations, but also those exposed border portions of the undesired locations.

In view of this, what has been referred to as borderless contacts have been fabricated. However, in the case of for instance SRAM cells, a limiting factor for shrinking the cells is the contact to diffusion with respect to gate-conductor. This limiting factor ensures that the diffusion contact does not short to the gate conductor. This has been achieved by simply providing ample distance between the diffusion contacting gate such that the contact never intersects the gate within the process tolerances employed. Borderless contact allows the intersection of a contact to a "border" in the case of a SRAM cell being the gate, by providing means to prevent electrical shorts if the contact intersects the border, thereby permitting the distance between the border and the contact to be reduced. In addition, in a borderless contact it is necessary to contact the borderless element itself such as in the case of a SRAM cell permit contact to the gate conductor. To accomplish this, a separate gate contact mass has previously been used, but this adds another critical mask step. Accordingly, it would be desirable to provide a method for achieving a borderless contact to diffusion and gate contact that does not cause shorting and does not require additional masking steps.

SUMMARY OF INVENTION

The present invention is concerned with providing a borderless contact to diffusion with respect to gate conductor. In particular, according to the present invention, borderless contact is achieved while guarding against shorting. Moreover, according to a preferred aspect of the present invention a borderless contact is achieved employing a single contact mask.

More particularly, the present invention is concerned with a semiconductor structure that comprises a semiconductor substrate; a conductive region on the substrate; borderless contacts adjacent the conductive regions; and the conductive regions having intermittent self-aligned insulating caps for protecting the borderless contacts, and having capless areas for contacting the conductive regions.

In addition, the present invention is concerned with a method for fabricating such a semiconductor structure. In particular, the process of the present invention comprises providing a semiconductor substrate; providing a first insulating layer on the semiconductive substrate and forming a conductive layer on the first insulating layer. A second insulating layer is formed on the conductive layer and a third insulating layer is formed on the second insulating layer. Next, the process involves selectively removing a portion of the second and third insulating layers in a predetermined pattern and then forming a damage prevention layer where the second and third insulating layers were removed. The damage prevention layer is a self-aligned layer formed by oxidation of the conductive layer to permit removal of the third insulating layer. Preselected portions of the remaining third insulating layer is selectively removed in a predetermined pattern followed by removing the damage prevention layer without etching the conductive layer. The exposed portions of the conductive layer uncovered by the second insulating layer is now removed. The second insulating layer exposed by the removal of the third insulating layer is removed to thereby provide the desired semiconductor structure.

According to a further aspect of the present invention, an alternative method for fabricating structures with borderless contact to diffusion with respect to gate conductor is provided. This alternative process includes providing defined conductive gate structure on semiconductor substrate and blanket depositing a barrier layer followed by blanket depositing a first insulating layer. The first insulating layer is polished with the gate stack of the barrier layer and gate acting as the polish stop thereby exposing the top of the gate. Selected portions of the barrier layer and underlying gate portions are etched to correspond to those areas to be subsequently isolated from contacts to the diffusion. A conformal barrier layer is then deposited followed by a polysilicon layer for filling the recesses created in the gate regions. The polysilicon is polished stopping on the barrier layer. Exposed barrier layer is removed and a second insulating layer is deposited. This creates the material for forming contacts to the diffusion and gates in the areas not covered with the isolation cap.

In a still further embodiment of the present invention, fabrication of the desired structure is achieved by providing conductive gate on a semiconductor substrate, blanket depositing a barrier layer over the gate and substrate, and blanket depositing a non-conformal first insulating layer over the barrier layer. The non-conformal layer is thicker on the horizontal surfaces as compared to the vertical sidewalls of the gate structure. A sacrificial metallic layer is deposited and selectively polished so that the polish will stop on the protruding insulating peaks on top of the conductive gate lines. The insulating layer is etched with the etch stopping on the underlying barrier layer. Recess areas in the insulating layer above the gate regions which are to receive a protective cap are filled and planarized with the tops of the remaining portions of the sacrificial layer. The sacrificial layer is then removed thereby leaving a cap on top of the gate regions that will act as an etch stop and insulating material for subsequent etching and filling to provide the self aligned contact. The structure is then covered with a second insulating layer which can then be planarized. The structure is then patterned and etched with contacts to diffusion that are borderless to the already capped conductive gate lines. Those areas of the conductive gates lines that are not capped are capable of being contacted with the same etch used in the patterning for the diffusion contacts.

A still further embodiment of the present invention comprises blanket depositing a barrier layer over preformed gate and over semiconductor substrate and then depositing a first insulating layer over the barrier layer. The insulating layer is planarized and the structure is masked so that open regions correspond to where the gates are to be subsequently capped. The first insulating layer is etched above the gates in those regions where the gate is to be subsequently capped. A second barrier layer is selectively deposited above the exposed barrier areas remaining above portions of the gate. A second insulating layer is deposited and then planarized. At this point, the contacts to diffusion that are borderless to the gate can be patterned and etched.

Another embodiment for fabricating structures according to the present invention includes blanket depositing a barrier layer over preformed gate structure and the semiconductor substrate, depositing an adhesion promoting layer over the barrier layer and blanket depositing a first insulating layer over the adhesion promoting layer. The first insulating layer is polished stopping on the adhesion layer on top of the gate. A chemically amplified photoresist is deposited. Those portions of the resist in direct contact with the adhesion promoting layer become poisoned or resistant to removal after the exposure and bake. The resist is then exposed to electromagnetic radiation and then baked and developed. Those portions of the resist contacting the adhesion promoting layer due to poisoning remain after the development and serve as a cap above those portions of the gate that are to be protected from contact with the diffusions. The first insulating layer is etched exposing the adhesion promoting layer underneath it which is then also removed by etching and the barrier layer underneath it is partially etched. This provides for a difference in thickness in the barrier layer from the top of the gate structure to the diffusions that will be needed to make a contact self-align to the gate. Next, any remaining resist is removed and adhesion layer is removed from above the gate portions. A second insulating layer is blanket deposited and then planarized and patterned to provide contact self-aligned to the gate.

In a further variation of the above process, the initial polishing of the first insulating layer could be terminated leaving a relatively thin layer of insulating layer over the gate followed by masking to select those areas above the gate that are to be subsequently capped. This can be followed by etching to expose areas of the gate that would retain the extra capping and then the process could proceed as described above.

A further process of the present invention includes blanket depositing a barrier layer over preformed gate structure and blanket depositing a layer of an oxidizable material followed by depositing a second barrier layer. A planarizing layer is deposited and is then patterned exposing the second barrier layer above those portions of the gate which are to be borderless. The second barrier layer is removed in those areas exposed by removal of the planarizing layer. The remaining planarizing layer is now removed providing a layer of the oxidizable material exposed where the gates are to be borderless. The exposed oxidizable material is then oxidized. The remaining second barrier layer is removed. The remaining oxidizable material is then removed resulting in a structure having the oxidized material capping the gate in those preselected regions where the gate is to be borderless to the diffusion. The structure can then be subjected to standard processing with the oxidized layer acting as an etch stop so that during contact etching to diffusion, the contact will not short to the gate regions.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
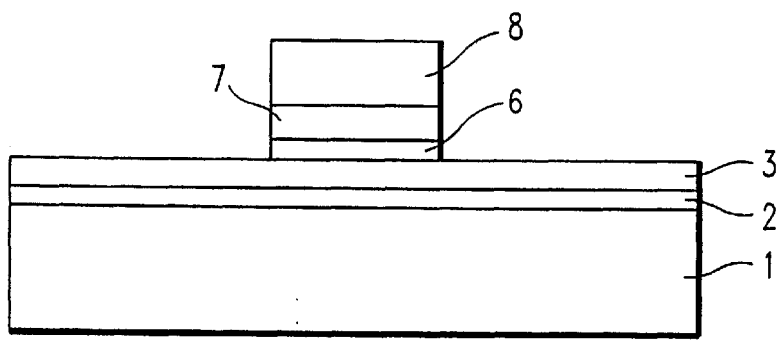
FIGS. 1–5 are schematic diagrams of the structure in various stages of the processing according to an embodiment of the present invention.

In order to facilitate an understanding of the present invention, reference will be made to the figures which illustrate a diagrammatic representation of the steps of one embodiment of the present invention. According to the present invention, a first insulating layer 2 is provided on a semiconductor substrate 1. The semiconductor substrate 1 is typically silicon but can be any other semiconductor material such as group III-V semiconductor. The insulating layer 2 can be grown on the substrate or can be provided by deposition technique such as chemical vapor deposition (CVD) or physical vapor deposition (PVD). Also, the insulating layer 2 can be provided by thermal oxidation of the substrate 1 to provide a silicon dioxide. Typically, this layer is about 20 A to about 350 A thick and more typically about 30 A to about 100 A thick and acts as a gate insulator.

A conductive material 3 such as a doped polycrystalline silicon layer is provided on the insulating layer 2. The conducting layer 3 can form gate electrodes in the semiconductor devices which are to be formed on the semiconductor substrate. Typically, the conductive layer 3 is about 500 A to about 4000 A thick and more typically about 1500 A to about 3000 A thick.

A second insulating layer 6 is provided on the conductive layer 3. Typically, this layer is about 300 A to about 1500 A thick and more typically about 500 A to about 1000 A thick. Also, typically this insulating layer 6 is an oxide which can be formed by oxidation of a deposited tetraethylorthosilicate, followed by heating to temperatures of about 400° C. to about 750° C. to form the oxide or more commonly by CVD deposition.

Next, a third insulating layer 7 is provided on the second insulating layer 6. The third insulating layer 7 is typically about 500 A to about 2500 A and more typically about 1000 A to about 2000 A thick and more typically about 1500 A to about 2000 A thick. Moreover, the third insulating layer is typically at least about two times as thick as the second insulating layer. The relative thicknesses, however, between the second insulating layer and third insulating layer will vary depending upon relative etch rate ratios between the second insulating layer and third insulating layer.

Selected portions of the insulating film stack of the second and third insulating layers is removed such as by etching in a predetermined pattern. For instance, such is removed in a pattern for defining the gate conductor shapes for the entire chip. In particular, the portions can be removed by employing conventional photolithographic techniques such as by applying a photosensitive resist material 8 and then patterning it to provide the desired gate structure. The patterned photoresist then acts as a mask for removing exposed portions of the third insulating layer and then second insulating layer while protecting against etching the other portions of the second and third insulating layers.

The third insulating layer in the case of nitride can be removed by reactive ion etching or downstream plasma source etching. Likewise, the oxide layer 6 can be removed using reactive ion etching.

Figure 2:
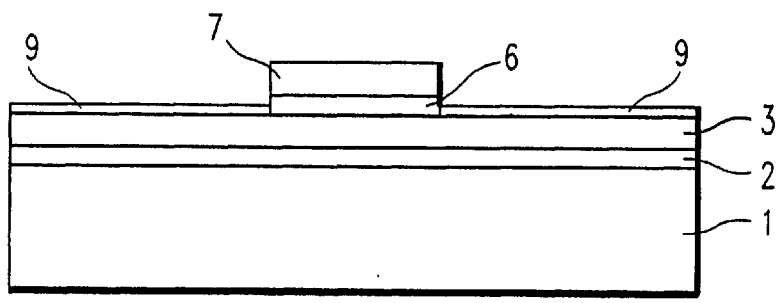

Next, the photoresist remaining is removed by for instance dissolving in a suitable solvent. After removal of the photoresist, a damage preventing layer 9 can be provided over the conductive layer where the second and third insulating layers have been removed (see FIG. 2). The damage preventing layer can be provided by thermal oxidation of a polysilicon conductive layer and is typically about 20 A to about 350 A thick and preferably about 60 A to about 150 A thick, about 100 A being typical. The oxide can be thermally grown on the polysilicon but will not grow on the nitride layer. This oxide layer provides a nitride etch stop.

Figure 3:
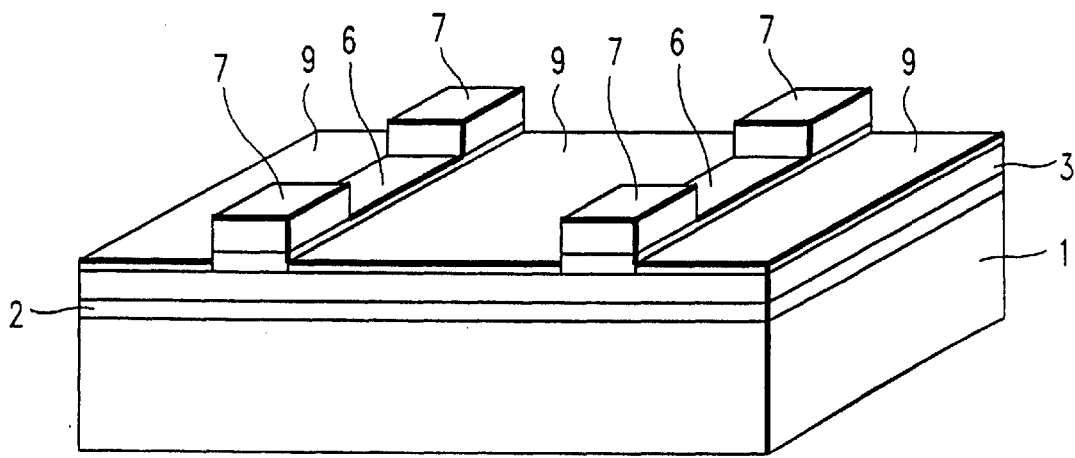

Preselected portions of the third insulating layer is removed in a predetermined pattern by applying a mask (see FIG. 3). The third insulating layer can be etched using reactive ion etching and provides for gate contact. The remaining resist is then removed by dissolution in a suitable solvent.

Figure 4:
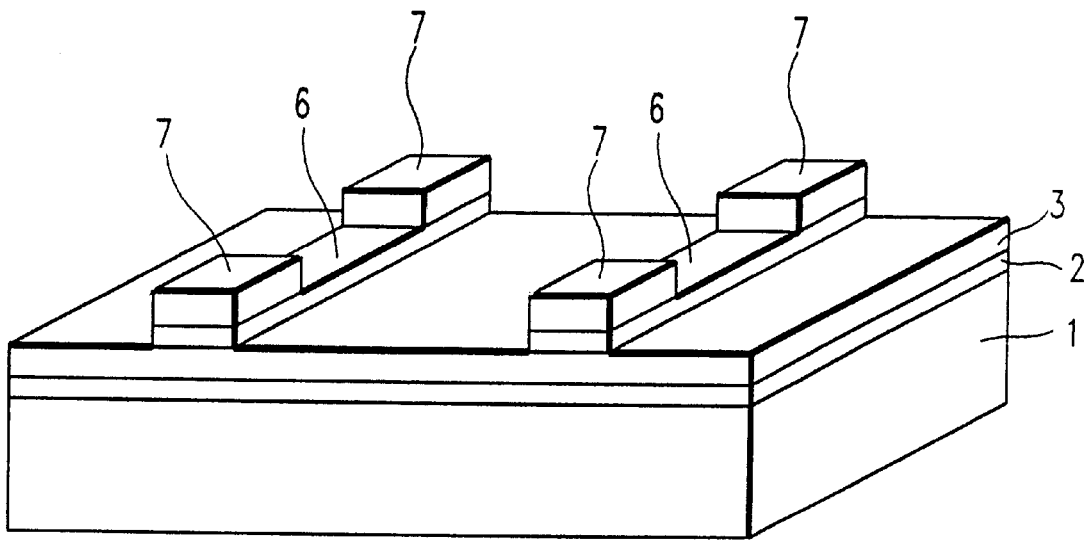

Next, the thin damage preventing layer is removed and since it is significantly thinner than the exposed second insulating layer, the damage preventing layer is removed while the second insulating layer still remains in place (see FIG. 4).

Figure 5:
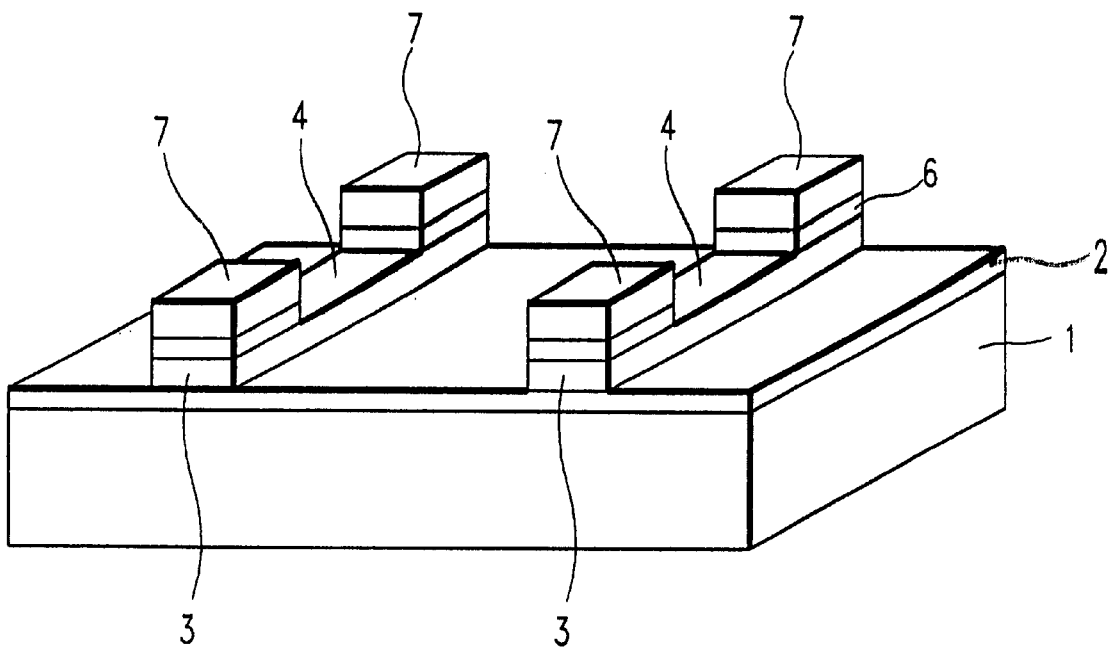

Portions of the conductive layer are removed using both the second and third insulating layers as a mask (see FIG. 5). Those portions of the second insulating layer that were uncovered by removal of the third insulating layer are then removed thereby exposing underlying conductive layer providing area 4 for normal logic contacts and subsequent self-aligned silicide formation.

As can be appreciated from above, the above method of the present invention provides for normal gate formation in those areas where a borderless contact is not required, and where self-aligned silicide processing must take place, by applying a masking layer. This mask, as can be appreciated, protects the insulator stack in areas where it is desired to have borderless contacts to gate; the nitride cap insulator is removed everywhere else, stopping on the oxide. A short oxide etch removes the remaining etch stop oxide from top of the conductor.

Figure 22:
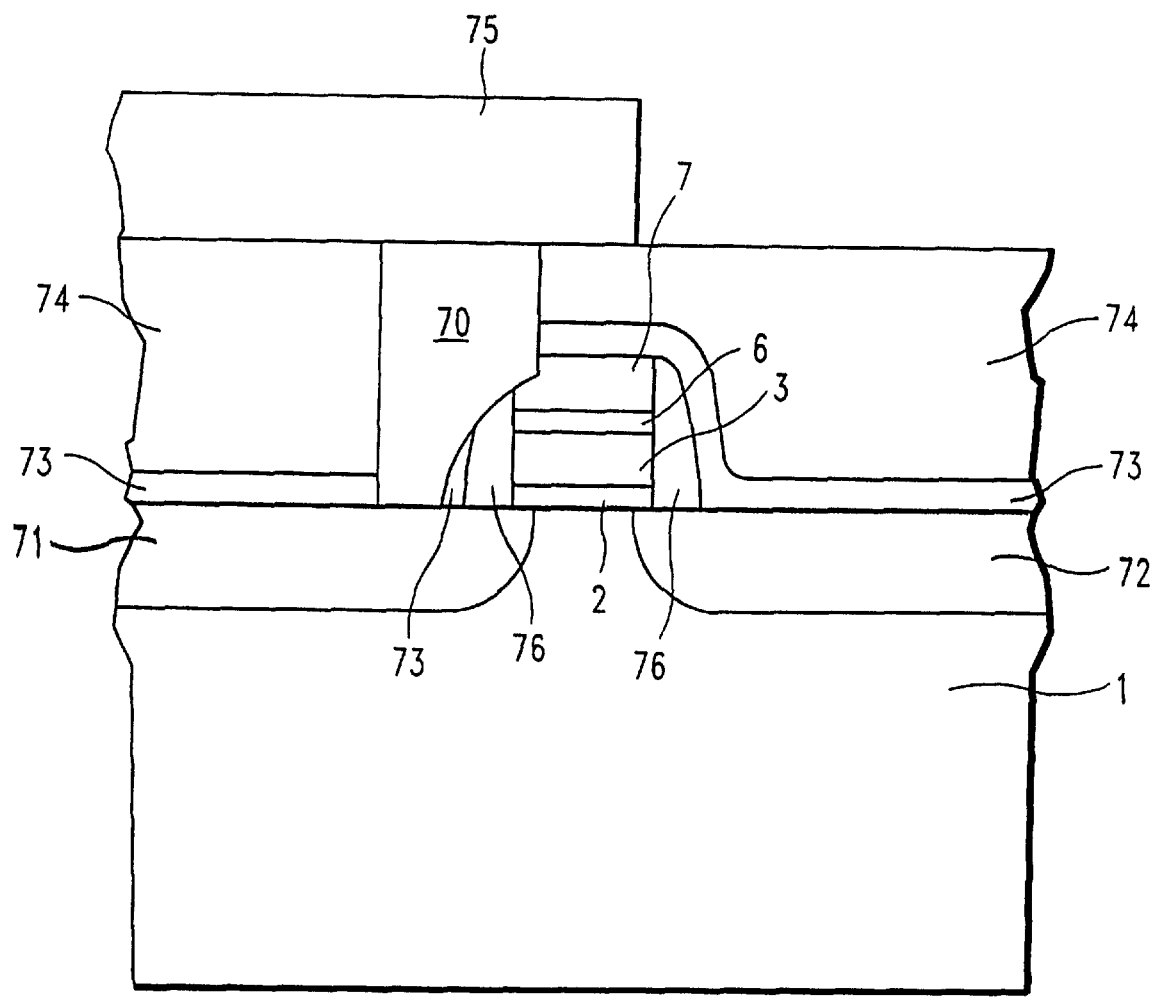
FIG. 22 is a schematic diagram of a structure according to the present invention.

An advantage of this method of the present invention is that the gate conductor lithography is performed on a planar surface, thus providing for optimum dimensional control. Moreover, the gate conductor etch is performed with a hard mask (the nitride and oxide) which has been shown to provide improved dimensional control. These advantages are achieved according to the present invention while providing a means for creating a borderless contact on a device where density is desired over gate conductivity. Moreover, see FIG. 22 which illustrates an advantage achievable by the present invention and particularly the presence of the third insulation layer which allows for misalignment of subsequently to be provided contact stud 70 such as tungsten. The layer protects against the stud from contacting the underlying conductive material 3 such as the doped polycrystalline silicon. In FIG. 22, numerals 71 and 72 represent source and drain regions; 73 represents optional auxiliary nitride etchings; 74 represents interleval dielectric, 75 represents metal wiring; and 76 represents sidewall isolation.

These can be provided by techniques well known in the art and need not be described herein in any detail.

In an alternative embodiment according to the present invention (see FIG. 6) after the device has been processed including forming the gate structures but before the contacts to diffusion and gate have been made, a standard barrier layer such as silicon nitride 22 is blanket deposited over gate structure 21 and over insulating layer 2 on substrate 1. The conductive gate 3 is provided by polycrystalline silicon, the top portion of which has been silicided. An insulating layer 23 is blanket deposited over layer 22. The insulator layer 23 can be silicon dioxide and can be provided by a deposition technique such as chemical vapor deposition (CVD) or physical vapor deposition (PVD). Typically, the silicon nitride layer 22 is about 100 A to about 1000 A thick and more typically about 250 A to about 750 A thick. Also, the insulating layer 23 is typically about 2000 A to about 5000 A thick and more typically about 3000 A to about 4000 A thick.

Figure 6:
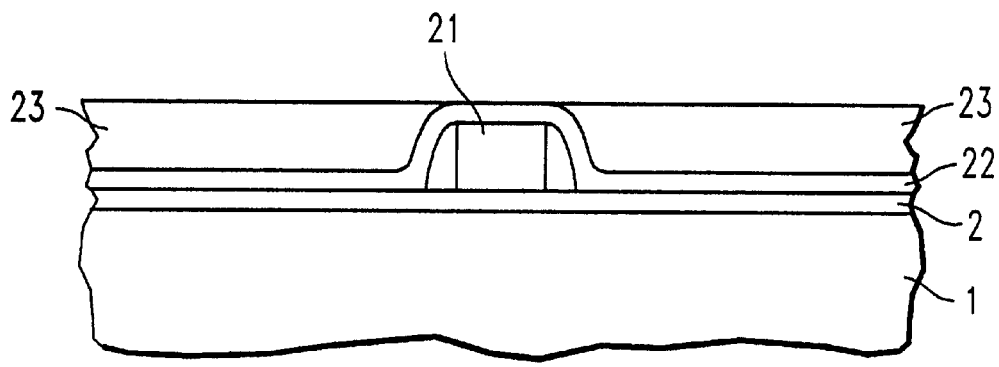
FIG. 6–8 are a schematic diagram of a structure in various stages of an alternative process according to the present invention.

Critical to this alternative process of the present invention, is the step of polishing back insulating layer 23 by chemical-mechanical polishing (CMP) to the gate structure where the gate stack acts as the polish stop thereby exposing the top of the gates as shown in FIG. 6.

Figure 7:
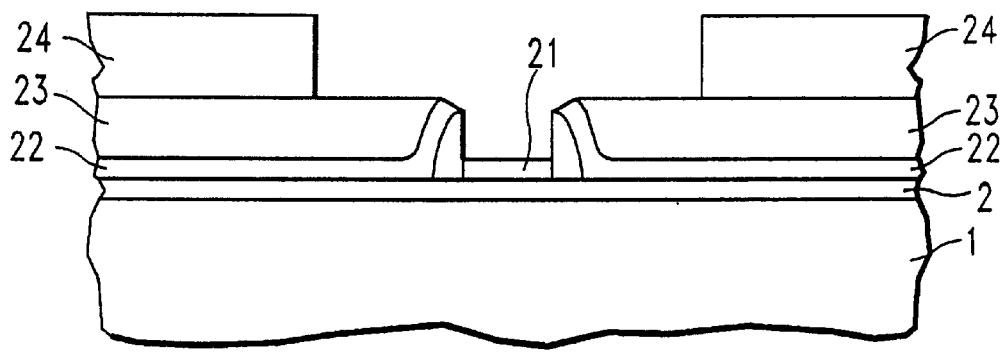

According to preferred aspects of the present invention, the wafer is now patterned using a photoresist 24 where openings remaining in the patterned photoresist correspond to those areas of the gate that are to be isolated from the contacts to diffusion (see FIG. 7). The patterned areas are then etched to remove the exposed silicon nitride cap 22, and the silicide at the top portion of the gate as well as a fraction of the gate structure to thereby provide recessed gate structure. The etchant employed is preferably a reactive ion etch using a chemistry which does not result in etching the surrounding insulation layer 23 to any appreciable extent.

The resist layer 24 remaining can then be stripped and the recessed polycrystalline silicon can be silicided if needed. In a preferred aspect of this embodiment of the present invention, a conformal barrier layer such as silicon nitride can then be deposited in order to fill the gate recess.

The silicon nitride barrier layer 25 is then subjected to a directional etch or CMP for removing nitride not in the groove created by the partial removal of the gate.

Figure 8:
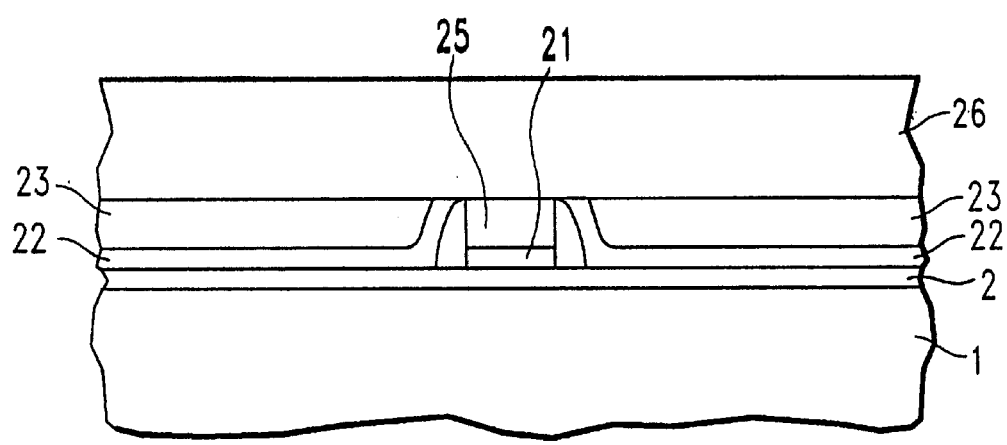

A second insulating layer such as silicon dioxide is deposited such as by chemical vapor deposition providing layer 26 in which to form contacts to the diffusions and also the gates in the areas that have not been covered with the silicon nitride cap (see FIG. 8).

Figure 9:
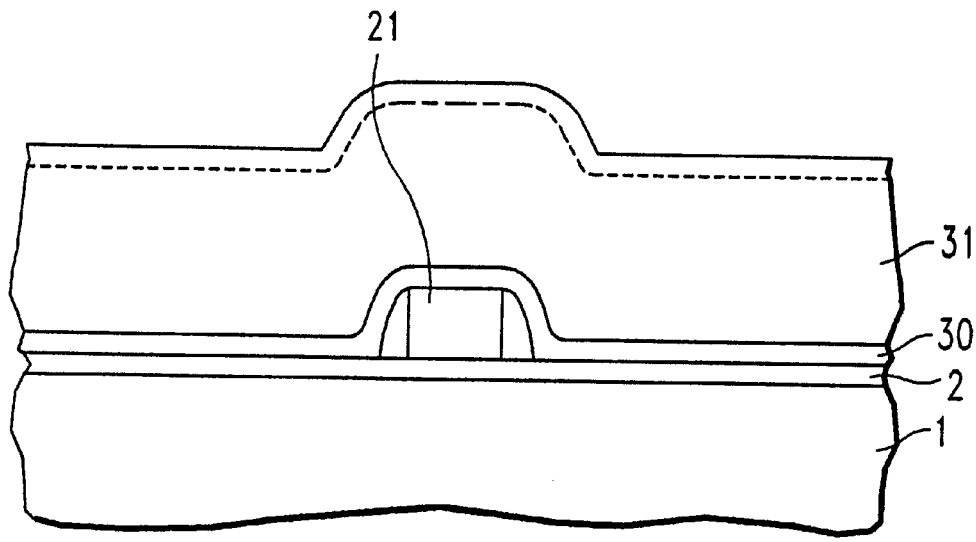
FIGS. 9–12 are schematic diagrams of the structure in various stages of the processing according to another embodiment of the present invention.

According to a third embodiment of the present invention (see FIG. 9) a conformal barrier layer 30 such as silicon nitride is blanket deposited over previously formed polysilicon gate 21, the upper portion of which being silicided and over gate oxide 2 on the semiconductor substrate 1. The conformal barrier layer which is preferably silicon nitride is typically at a thickness of about 100 A to about 1000 A and more typically about 250 A to about 750 A. Next, a nonconformal insulating layer is provided such as from silane oxide whereby the layer 31 is thicker on the horizontal surfaces than it is on the vertical sidewall surfaces adjacent the gate structures Typically the film 31 should be at least about 1.5 times, and more typically about 2 times thicker on the horizontal surfaces than it is on the sidewall surfaces, a typical example being about 0.2 microns thick on the horizontal surfaces and about 0.05 microns thick on the sidewalls.

Figure 10:
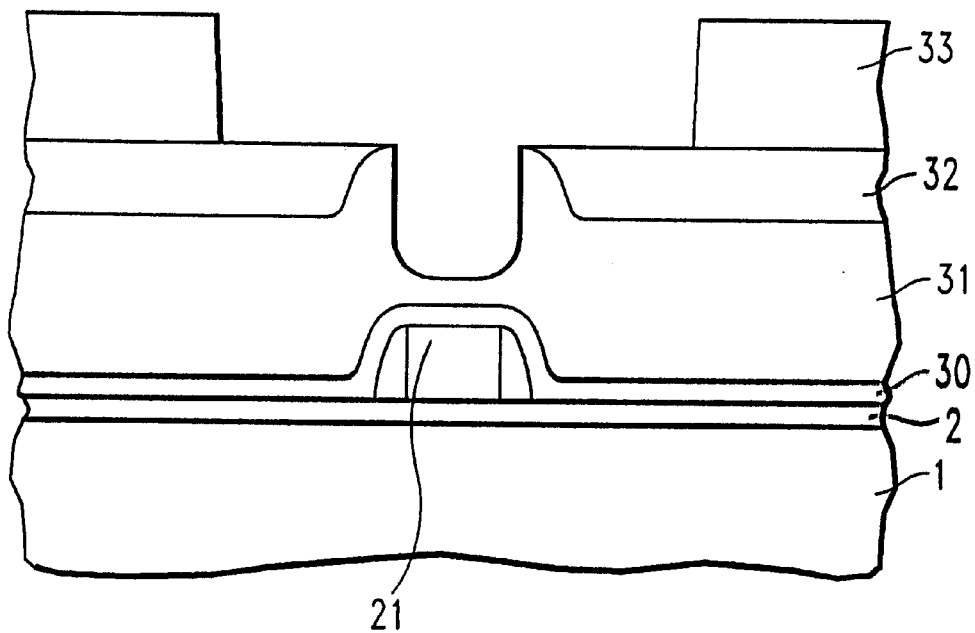

Typically, this layer is about 100 A to about 500 A thick, and more typically about 200 A to about 300 A thick. A sacrificial layer 32 such as tungsten or TiN+tungsten is then deposited. The sacrificial layer is typically about 0.15 to about 0.4 microns thick, more typically about 0.2 to about 0.3 microns thick, a particular example being about 0.3 microns thick. The sacrificial layer 32 is then polished back to oxide whereby it would stop on protruding oxide peaks on top of the gate. The polishing is selective. As an alternative at this stage in the process, the wafer can be patterned with the areas where a cap on the polysilicon lines is needed are opened. The wafer is then etched to remove oxide layer with the etch stopping on the underlying nitride layer. The etch is selective to the tungsten sacrificial layer 32 (see FIG. 10).

Figure 11:
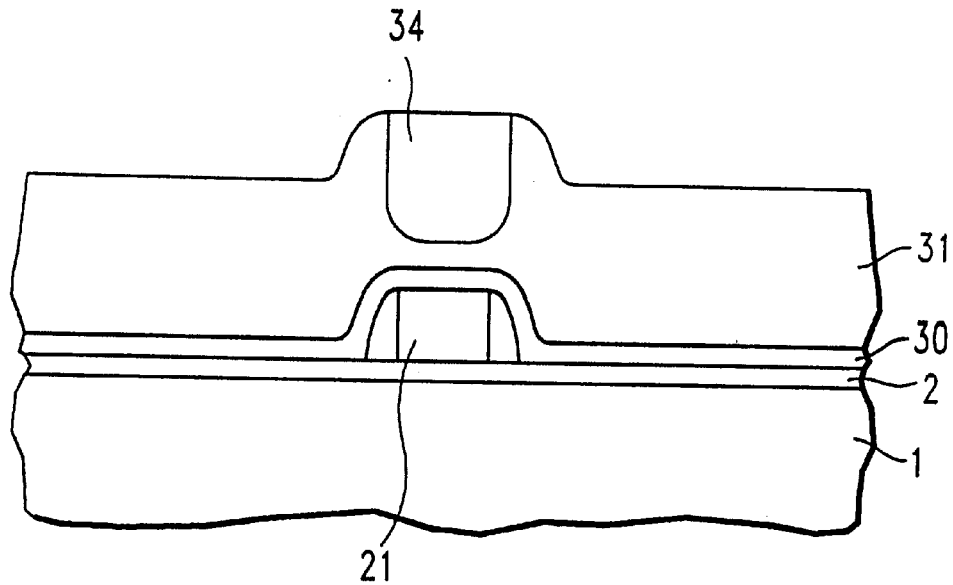
Figure 12:
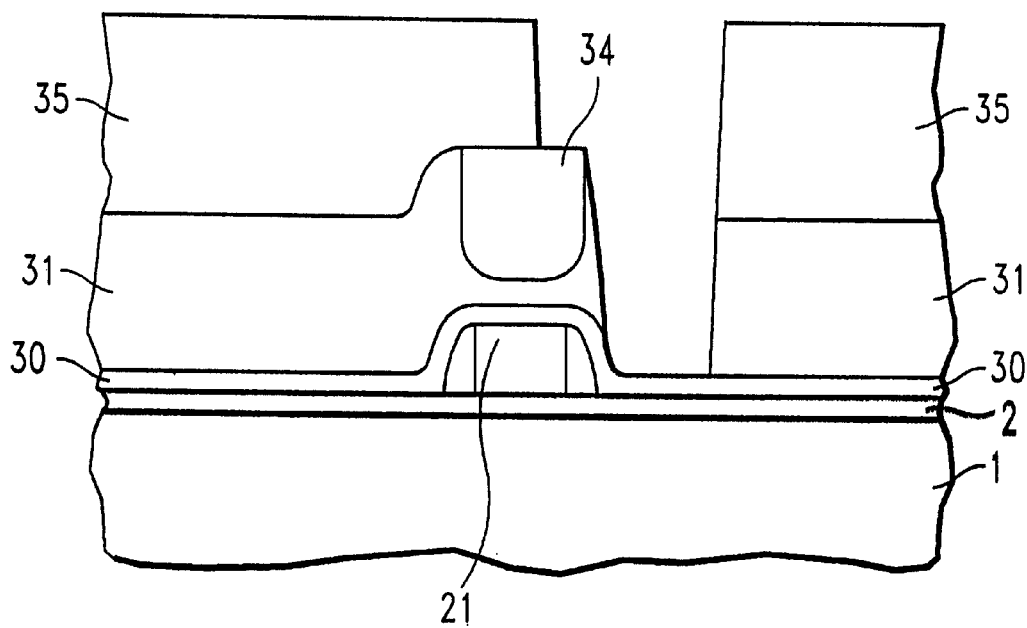

The remaining resist is removed (see FIG. 11) resulting in a structure wherein the areas over the polysilicon line that are going to be capped are recessed areas surrounded by the sacrificial layer 32. The recesses can now be filled such as by employing CVD silicon nitride 34 followed by polishing back to planarize it with the top of the sacrificial layer 32.

The sacrificial layer 32 can now be removed such as by a wet dip etching process. This results in providing a cap above the polysilicon line that will serve as an etch stop and insulating material when etching and filling the self-aligned contacts is to be carried out.

The nonconformal oxide 31 can be left intact. The structure can now be covered with a further oxidizing layer 35 such as doped silicate glass such as boron and/or phosphorus doped silicate glass. The other oxide layer 31 can then be polished resulting in a structure that can be subjected to standard patterning and etching for contacts to diffusion that are borderless to the now capped polysilicon line. Those areas of the polysilicon line that are not capped are capable of being contacted with the same etch.

Figure 13:
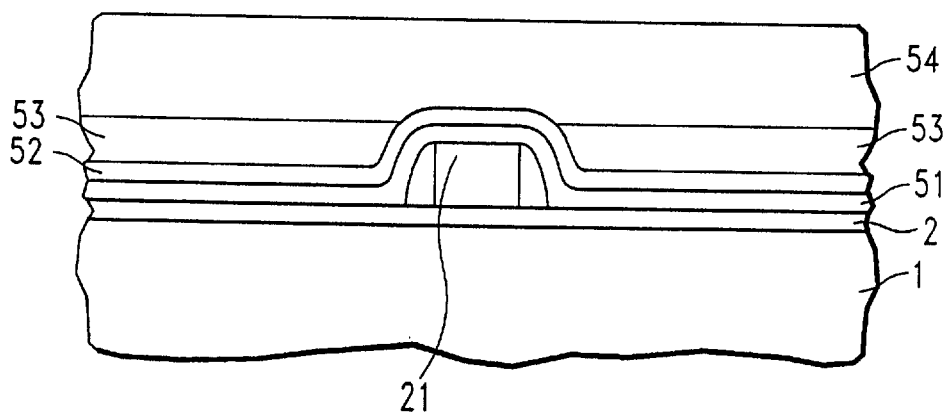
FIGS. 13–15 are schematic diagrams of the structure in various stages of the process according to a further alternative embodiment of the present invention.

In a still further embodiment (see FIG. 13), a conformal barrier layer such as silicon nitride 51, approximately 2000 A thick, is blanket deposited. An adhesion promoting layer such as titanium nitride 52 can be deposited such as by sputtering. The adhesion promoting layer is typically about 50 A to about 1500 A thick, more typically about 300 A to about 700 A thick, a particular example being about 500 A thick. A doped silicate glass 53 is deposited to provide an insulating layer. This layer is typically about 2000 A to about 6000 A thick, more typically about 3000 A to about 5000 A thick, a particular example being about 4000 A thick. The doped silicate glass such as BPSG is then polished by CMP with the polish stopping on the etch stop layer above the polysilicon lines exposing the titanium nitride over the polysilicon lines. A photoresist 54 can then be deposited such as by spinning. The photoresist 54 is then exposed to electromagnetic radiation of appropriate wavelength followed by baking and developing. The photoresist is a chemically amplified photoresist which is susceptible to substrate poisoning such as APEX which is a p-hydroxy styrene based DUV photoresist available from Shipley. By employing the chemically amplified resist, those portions of the resist that are in direct contact with the titanium nitride would be poisoned. Accordingly, after exposure, bake and development, the resist would be fully developed where the resist is in contact with the titanium nitride, but a resist layer would remain in regions where the resist is in contact with the titanium nitride.

Figure 14:
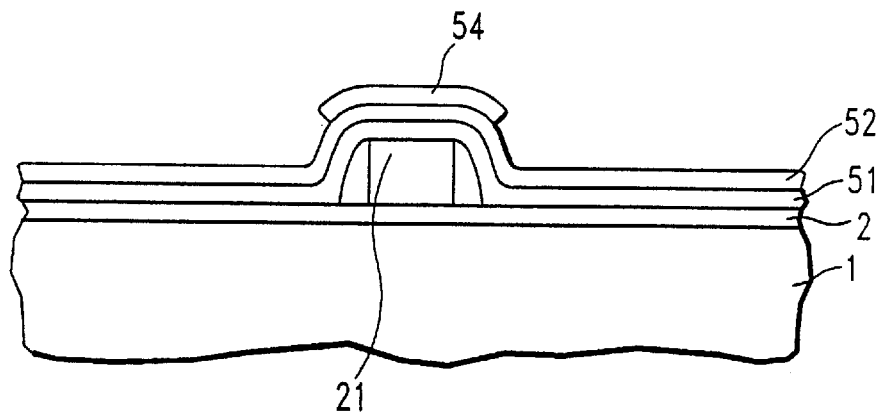
Figure 15:
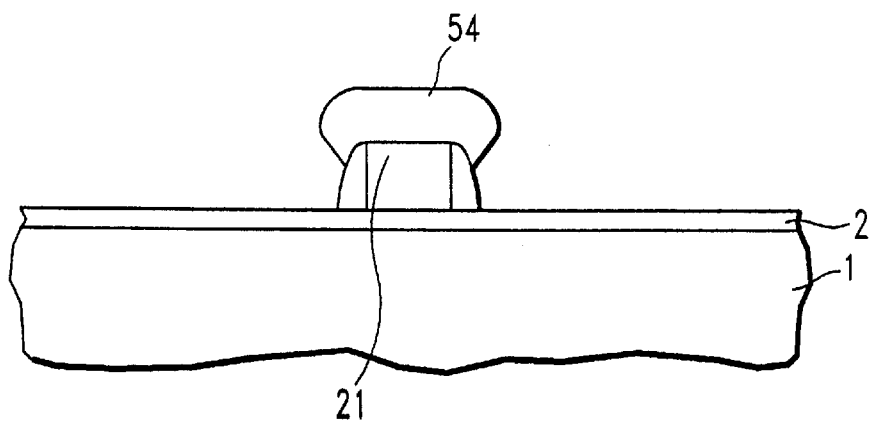
Figure 16:
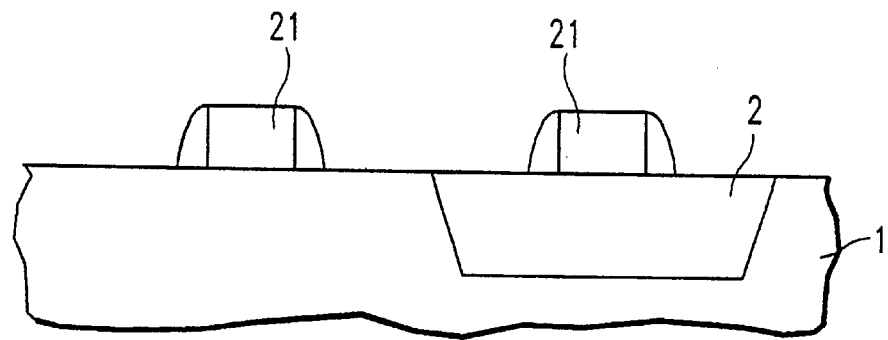
FIGS. 16–21 are schematic diagrams of the structure in various stages of processing according to another embodiment of the process of the present invention.
Figure 17:
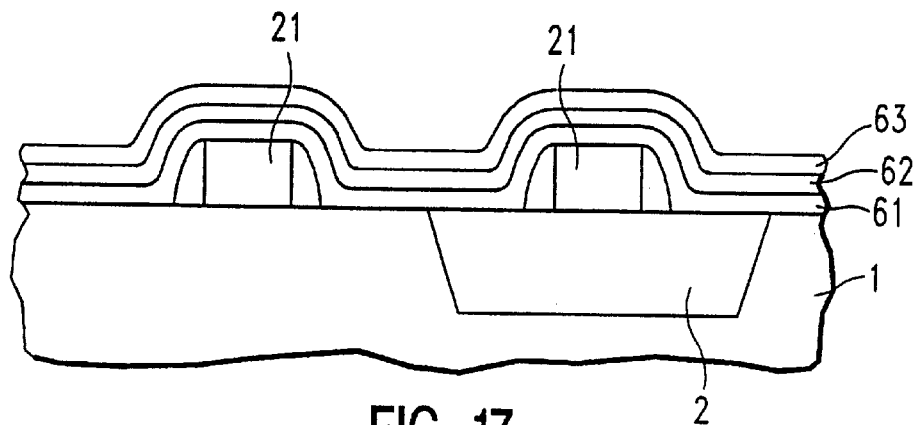
Figure 18:
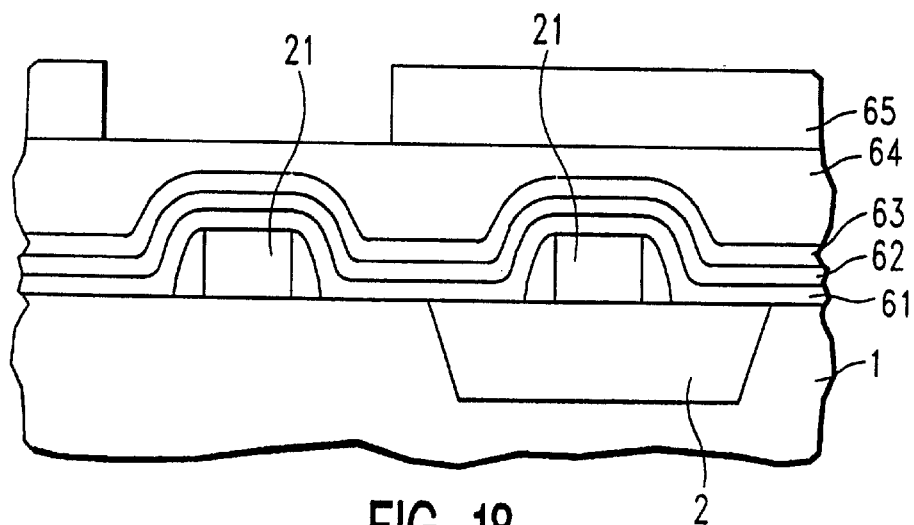
Figure 19:
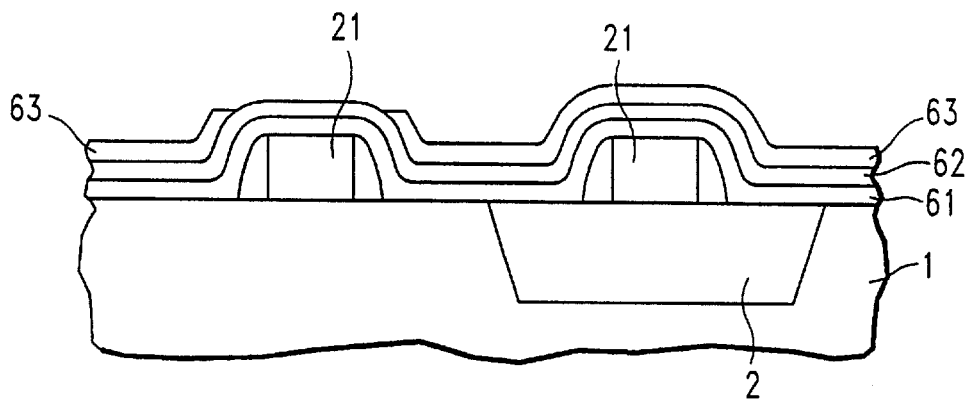
Figure 20:
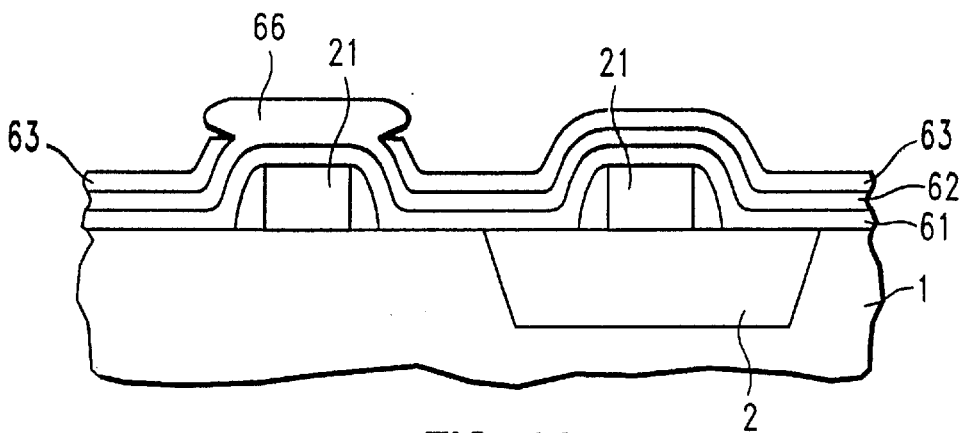
Figure 21:
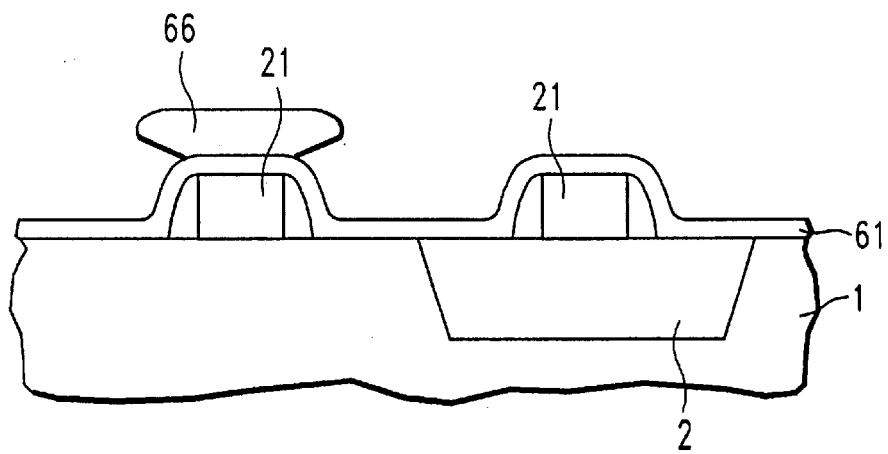

The cap of poisoned resist above the portions of the polysilicon line now serve as a protective barrier to preserve the nitride on top of the polysilicon line (see FIG. 14). The doped silicate glass can then be removed such as by wet etching using an aqueous HF acid etch resulting in exposure of the underlying titanium nitride layer. The portion of the titanium nitride layer exposed can then be removed such as by reactive ion etching. This etch will also remove a portion of the silicon nitride beneath the titanium nitride. This creates a thickness difference in the nitride film from the top of the polysilicon line to the diffusions that will be needed to make a contact self-align to the polysilicon gate. Next, the remaining resist material is then removed such as by plasma stripping techniques followed by removing the titanium nitride over the polysilicon line. A doped silicate glass is then deposited, planarized and patterned to thereby etch the contacts that are self-aligned to the gate.

In an alternative variation of this process, the initial polishing of the doped silicate glass 53 can be carried out to leave a small portion such as about 0.2 microns over the gate region. Then, a block mask is provided for determining the areas over the gate that are to be subsequently capped. Reactive ion etching would then expose the areas of the polysilicon 21 that would retain the extra capping thickness of silicon nitride.

FIGS. 16–21 illustrate a further embodiment of the present invention. In this alternative process, a conformal barrier layer 61 such as silicon nitride is deposited over already formed polysilicon gate structure 21 and over the gate insulator. A layer of an oxidizable material 62 such as aluminum is deposited. This layer is typically about 100 A to about 500 A thick, more typically about 200 A to about 300 A thick, example being about 250 A thick. A second barrier layer 63 such as silicon nitride is then blanket deposited over the oxidizable layer 62. This layer is typically about 200 A to about 1000 A thick, more typically about 400 A to about 600 A thick. A planarizing layer such as an organic antireflective coating (ARC) 64 is deposited typically to a thickness of about 100 A to about 500 A and more typically about 200 A to about 300 A over the tops of the polysilicon gates 21. The thickness of the planarizing layer is typically approximately the height of the gates 21 (e.g. approximately 0.2 μm. A layer of photoresist 65 is then applied and patterned such as using a contact mask. The wafer is then subjected to a reactive ion etch to remove selected portions of the ARC layer with the reactive ion etching ending upon exposure of the barrier layer on top of the gates such as the silicon nitride layer 63. The exposed silicon nitride on top of the gates is then removed in selected portions using a selective reactive ion etch. The remaining resist and ARC are then removed using standard oxygen or ozone fusion stripping resulting in a layer of oxidizable material 62 such as titanium nitride or aluminum exposed where the gates are to be borderless.

The exposed oxidizable material 62 such as aluminum is thermally oxidized such as by placing the wafer in a rapid thermal anneal tool or furnace. The remaining silicon nitride 63 is removed such as using a chemical wet etch. The underlying oxidizable layer 62 is then removed by etching, leaving a cap of oxide 66 such as aluminum oxide on top of the gates that need to be borderless to the diffusion. The remaining processing can be carried out whereby the oxide 66 acts as an etched stop so that during contact etch to diffusion, the contact will not short to the gate.

In addition, in any of the above processes, if desired, the cap can be made to overhang to the polysilicon line to assure against shorting to the gate and also to control capacitance between the gate and the contact.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for fabricating a semiconductor structure which comprises providing a semiconductor substrate;

providing a first insulating layer on said semiconductor substrate;

providing a conductive layer on said first insulating layer;

providing a second insulating layer on said conductive layer;

providing a third insulating layer on said second insulating layer and being a different material than said second insulating layer;

selectively removing first portions of said third insulating layer and corresponding first portions of said second insulating layer in a predetermined pattern;

providing a damage preventing layer on said conductive layer in those areas where said second insulating layer and said third insulating layer have been removed;

selectively removing second portions of the remaining third insulating layer after removal of the first portions of said third insulating layer;

removing said damage preventing layer;

removing first portions of said conductive layer that have been uncovered by removal of the first portions of said second insulating layer; and removing those portions of said second insulating layer having been uncovered by removing the second portions of said remaining third insulating layer.

2. The method of claim 1 wherein said second insulating layer is an oxide.

3. The method of claim 2 wherein said oxide is about 300 A to about 1500 A thick.

4. The method of claim 2 wherein said oxide is about 500 A to about 1000 A thick.

5. The method of claim 1 wherein said third insulating layer is silicon nitride.

6. The method of claim 5 wherein said silicon nitride is about 1000 A to about 2000 A thick.

7. The method of claim 5 wherein said silicon nitride is about 1500 A to about 2000 A thick.

8. The method of claim 1 wherein said conductive layer is polycrystalline silicon.

9. The method of claim 1 wherein said damage preventing layer is silicon oxide.

10. The method of claim 9 wherein said silicon oxide is about 20 A to about 350 A thick.

11. The method of claim 9 wherein said silicon oxide is about 60 A to about 150 A thick.

* * * * *